United States Patent [19]
Yoshida et al.

[11] Patent Number: 5,719,429
[45] Date of Patent: Feb. 17, 1998

[54] HIGH FREQUENCY/HIGH OUTPUT INSULATED GATE SEMICONDUCTOR DEVICE WITH REDUCED AND BALANCED GATE RESISTANCE

[75] Inventors: Isao Yoshida, Tokyo; Mineo Katsueda, Hachioji; Yasuo Maruyama, Takasaki, all of Japan

[73] Assignee: Hitachi, Ltd., Tokyo, Japan

[21] Appl. No.: 579,288

[22] Filed: Dec. 27, 1995

[30] Foreign Application Priority Data

Dec. 27, 1994 [JP] Japan ................... 6-326010

[51] Int. Cl.⁶ .................... H01L 29/76; H01L 29/94
[52] U.S. Cl. .............................. 257/401; 257/382
[58] Field of Search .......................... 257/382, 401

[56] References Cited

FOREIGN PATENT DOCUMENTS 6-5752  1/1994  Japan ................... 257/401

*Primary Examiner*—Steven H. Loke
*Attorney, Agent, or Firm*—Antonelli, Terry, Stout, & Kraus, LLP

[57] ABSTRACT

An insulated gate semiconductor device, which improves high frequency characteristics by reducing the resistance of a path from a gate bonding portion to each gate and eliminating an unbalance in resistances of respective gates, and which obtain a higher output by eliminating a limitation in current capacity due to the thickness of a first metal layer. In this insulated gate semiconductor device, a first aluminum layer is connected in parallel onto a gate electrode made of polycrystalline silicon. The adjacent gates, each having such a double layer structure, extend outside channel regions and are connected to each other. A lead-out electrode of a second aluminum layer is connected to the center of the connection portion of the adjacent gates through an opening portion. A gate bonding portion is provided at the center of the lead-out electrode. Each of source and drain electrodes is also of a double layer structure having the first aluminum layer and the second aluminum layer.

6 Claims, 7 Drawing Sheets

HIGH FREQUENCY/HIGH OUTPUT INSULATED GATE SEMICONDUCTOR DEVICE WITH REDUCED AND BALANCED GATE RESISTANCE

BACKGROUND OF THE INVENTION

The present invention relates to an insulated gate semiconductor device, and particularly to an insulated gate semiconductor device suitable for high frequency/high output applications.

One example of an insulated gate semiconductor device of this type, is a high frequency/high output MOS type field effect transistor (hereinafter, referred to as "MOSFET") as described in Japanese Patent Publication No. Hei 6-5752.

FIG. 6A is a schematic plan view showing the configuration of the above-described prior art high frequency/high output MOSFET; FIG. 6B is a sectional view taken on line I—I of FIG. 6A showing an active region of the MOSFET; and FIG. 7 is a sectional view taken on line II—II of FIG. 6A showing a gate lead-out electrode portion of the MOSFET.

In these figures, reference numeral 21 indicates a p-type silicon substrate having a high impurity concentration; 22 is a p-type epitaxial layer; 23 is a silicon oxide film for a gate insulator; 24 is a conductive layer for a gate electrode, which is made of a compound of a refractory metal (for example, molybdenum) and silicon, that is, a metal silicide; 25 is an interval insulator; 26 is a source metal electrode made of a metal such as aluminum; 27 is a drain metal electrode made of a metal such as aluminum; 28 is a bonding metal electrode for gate external connection; 29 is an island-shape electrode having a resistivity lower than that of the conductive layer 24 for a gate electrode; 30 is a contact hole for connecting a source layer 35 having a high impurity concentration to the source metal electrode 26; 31 is a contact hole for connecting a drain layer 36 having a high impurity concentration to the drain metal electrode 27; 32 is a contact hole for the bonding metal electrode 28 for gate external connection; 33 is a bonding metal electrode for drain external connection, which is a widely extended portion of the drain metal electrode 27; 34 is a bonding metal electrode for source external connection, which is a widely extended portion of the source metal electrode 26; and 37 is a drain layer having a low impurity concentration. In addition, the drain layer 36 and the source layer 35, each of which has a high impurity concentration, are simultaneously formed in the same process.

As shown in FIGS. 6A and 6B, one-end of each of the stripe-shape conductive layers 24 for the gate electrodes, each of which is covered with the island-shape electrode 29 on a channel region, extend outside the channel regions and are connected to each other under the source metal electrode 26. The commonly connected stripe-shape conductive layers 24 for gate electrodes are then connected to the bonding metal electrode 28 for gate external connection. In addition, as shown in FIG. 7, the gate lead-out electrode portion is of a structure in which the source electrode 26 is superimposed on the conductive layer 24 for a gate electrode through the oxide film 25.

Incidentally, a conductive layer for a gate electrode is often made of a refractory metal such as molybdenum or tungsten for forming a source/drain region in self-alignment. The refractory metal, however, has a high reactivity against water and thereby it tends to be strongly oxidized. Consequently, in the case where a conductive layer for a gate electrode is made of a refractory metal, a suitable measure, for example, of adding a step of provision of a protection film against oxidation is required. On the contrary, in the high frequency/high output MOSFET having the configuration shown in FIGS. 6A, 6B and FIG. 7, the conductive layer for a gate electrode is made of a refractory metal silicide which has a high resistivity but is stable in an oxidizing atmosphere. In this high frequency/high output MOSFET, to reduce an increase in gate resistance due to the use of the refractory metal silicide, the island-shape electrode 29 having a low resistivity is, at a stripe-shape finger portion of the conductive layer 24 for a gate electrode, connected in parallel onto the conductive layer 24 made of the refractory metal silicide. This is effective to improve frequency characteristics and output characteristics in a high frequency region.

The prior art insulated gate semiconductor device having the above configuration, however, has the following disadvantage. In this insulated gate semiconductor device, as described above, the island-shape electrode 29 having a low resistivity is connected in parallel onto the conductive layer 24 at the gate-finger portion for the purpose of lowering an effect of using the refractory metal silicide having a high resistivity as the conductive layer for a gate electrode. However, the path of the gate lead-out electrode portion directly under the source electrode 26, which extends from the bonding metal electrode 28 for gate external connection to the gate-finger portion where the island-shape electrode 29 is connected in parallel onto the conductive layer 24, is still made of the refractory metal silicide having a high resistivity. Moreover, in the arrangement of the gate-finger portions, the path of the gate-finger portion apart from the bonding metal electrode 28 for gate external connection has a resistance higher than the path of the gate-finger portion near to the bonding metal electrode 28 for gate external connection. As a result, in a high frequency region ranging from 1 GHz to 5 GHz, an effect of the unbalance in the gate resistances of the conductive layers 24 for gate electrodes becomes larger, and further a delay occurs due to a capacitance between the conductive layer 24 for a gate electrode and the source metal electrode 26 and also due to the resistance of the conductive layer 24 for a gate electrode. This fails to obtain desirable high frequency characteristics.

The above-described prior art insulated gate semiconductor device has another disadvantage. Specifically, since the low resistance metal electrode made of aluminum or the like is constituted of one layer, the thickness of the metal electrode layer cannot be increased so much for forming a fine pattern. This makes it difficult to increase a current capacity and hence to obtain a higher output.

SUMMARY OF THE INVENTION

An object of the present invention is to provide an insulated gate semiconductor device capable of finely processing a gate electrode with a high reliability and forming source and drain layers in self-alignment, and further capable of obtaining desirable high frequency/high output characteristics by eliminating a limitation in current capacity due to the thickness of a first low resistance metal layer and arranging gate electrodes in such a manner as not to generate an unbalance in the gate resistances by way of respective gate-finger portions.

To achieve the above object, according to a first aspect of the present invention, there is provided an insulated gate semiconductor device wherein a double layer structure is provided for each gate electrode, having a lower conductive layer and;

a first metal conductive layer having a resistance lower than that of the conductive layer which is provided over the conductive layer with a first interval insulator formed between a part of the conductive layer and a part of the first metal conductive layer.

A second interval insulator provided in such a manner as to cover the first metal conductive layer, and a second metal conductive layer is provided on the second interval insulator. First layer drain electrode are made of the first metal conductive layer, and connected to the drain layer through an opening portion formed in the first interval insulator provided on the drain layer. First source electrodes are made of the first metal conductive layer and connected to the source layer through another opening portion formed in the first interval insulator provided on the source layer. Second layer drain electrodes are made of the second metal conductive layer and arranged such that one end of each is connected to a first layer drain electrode through an opening portion formed in the second interval insulator provided on the first layer drain electrodes and the other end is connected to the other end side of the adjacent second layer drain electrode. Second layer source electrodes made of the second metal conductive layer are arranged such that one end of each is connected to the first layer source electrode through an opening portion formed in the second interval insulator provided on the first layer source electrode and the other ends thereof forms an extended portion positioned outside the channel region.

The gate electrodes, which are adjacent to each other with the first layer drain electrode therebetween, extend outside the channel regions on one side of the second layer drain electrodes and are connected to each other, to form connection portions. Second layer gate electrodes, which are made of the second metal conductive layer, are provided such that one end of each is connected to the connection portion of the gate electrodes through an opening portion formed in the second interval insulator at the center of the connection portion of the gate electrodes, and the other end side thereof extends to an electrode for gate external connection through the space between the adjacent extended portions of the second layer source electrodes. This electrode for gate external connection is provided at the center of the commonly connected portion of the second layer gate electrodes.

In this insulated gate semiconductor device, opening portions for connecting the conductive layer for a gate electrode to the first layer gate electrode may be provided in the first interval insulator at a plurality of locations for each gate-finger portion. For example, as shown in FIG. 5A, rectangular opening portions 60 can be provided in an interval insulator 13 of a conductive layer 9 for a gate electrode in such a manner as to be spaced from each other at intervals of 20 μm.

A reach-through layer having the first conducting type, for example, a p-type reach-through layer 20 shown in FIGS. 3A and 3B, is preferably provided in the semiconductor layer directly under the extended portion of the source electrode in such a manner as to reach the semiconductor substrate. Moreover, a bottom surface source electrode (for example, indicated by the reference numeral 50 in FIGS. 3A and 3B) is preferably provided on the bottom surface of the semiconductor substrate.

In this case, as shown in FIGS. 3A and 3B, the p-type reach-through layer 20 may be provided at a portion separated from a channel region directly under a stripe-shape source electrode 10.

Base layers having the first conducting type, for example, p-type base layers shown in FIG. 3B, may be further provided in the channel region and a source layer forming region of the semiconductor layer in such a manner as to reach the semiconductor substrate.

The lower conductive layer of each electrode is preferably made of polycrystalline silicon or a metal silicide.

According to the insulated gate semiconductor device of the present invention, as described above, there is provided a second layer drain electrode made of the second metal conductive layer, which is arranged such that one end side thereof is connected to the first layer drain electrode through an opening portion formed in the second interval insulator provided on the first layer drain electrode and the other end side thereof is connected to the other end side of the adjacent second layer drain electrode. Accordingly, a limitation in current capacity in the case of provision of only the first layer drain electrode is lowered, that is, the current capacity is made larger, thus obtaining a higher output. Moreover, the bonding portion for drain external connection, which is made of the second metal conductive layer, allows a parasitic capacitance in the bonding portion for drain external connection to be reduced.

In this insulated gate semiconductor device, as described above, the second layer source electrode, which is made of the second metal conductive layer, is arranged such that one end side thereof is connected to the first layer source electrode through an opening portion formed in the second interval insulator provided on the first layer source electrode and the other end side thereof forms an extended portion positioned outside the channel region. This second layer source electrode is used as an electrode for source external connection, that is, a bonding pad portion. Moreover, in the configuration where the reach-through layer is provided directly under the extended portion and the bottom surface source electrode is provided on the bottom surface of the semiconductor substrate, the bonding of the source is not required, thereby reducing the inductance of the source.

Moreover, in this insulated gate semiconductor device, as described above, the first layer gate electrodes, which are adjacent to each other while putting the first layer drain electrode therebetween, extend outside the channel regions on one-end sides of the second layer drain electrodes together with the lower conductive layers for the gate electrodes and are connected to each other, to form connection portions; a second layer gate electrode, which is made of the second metal conductive layer, is provided such that the one-end side thereof is connected to the connection portion of the first layer gate electrodes through an opening portion formed in the second interval insulator at the center of the connection portion of the first layer gate electrodes, and the other end side thereof extends to an electrode for gate external connection through the space between the adjacent extended portions of the second layer source electrodes; and the electrode for gate external connection is provided at the center of the commonly connected portion of the second layer gate electrodes. Accordingly, an unbalance in gate resistances from the electrode for gate external connection to the gate-finger portions can be eliminated. Moreover, since the second layer gate electrode is connected to the electrode for gate external connection in such a manner as not to cross the source electrode, a parasitic capacitance between the source and gate can be reduced. This makes it possible to obtain desirable high frequency characteristics in a frequency band ranging from 0.5 to 5 GHz.

In the configuration where the opening portions for connecting the conductive layer for a gate electrode to the first layer gate electrode are provided by a plurality of pieces for each one gate-finger portion, a desirable connection can be ensured even when the width of the gate-finger portion is made fine.

In the configuration where the reach-through layer having the first conducting type is provided in a portion directly under the first layer source electrode, the source resistance can be reduced.

In the configuration where the base layers each having the first conducting type are provided in both the channel region and the source layer forming region of the semiconductor layer in such a manner as to reach the semiconductor substrate, it becomes possible to control the threshold value and to reduce the source resistance.

DETAILED DESCRIPTION OF THE INVENTION

Hereinafter, embodiments of an insulated gate semiconductor device according to the present invention will be described with reference to the accompanying drawings.

Embodiment 1

Figure 1A:
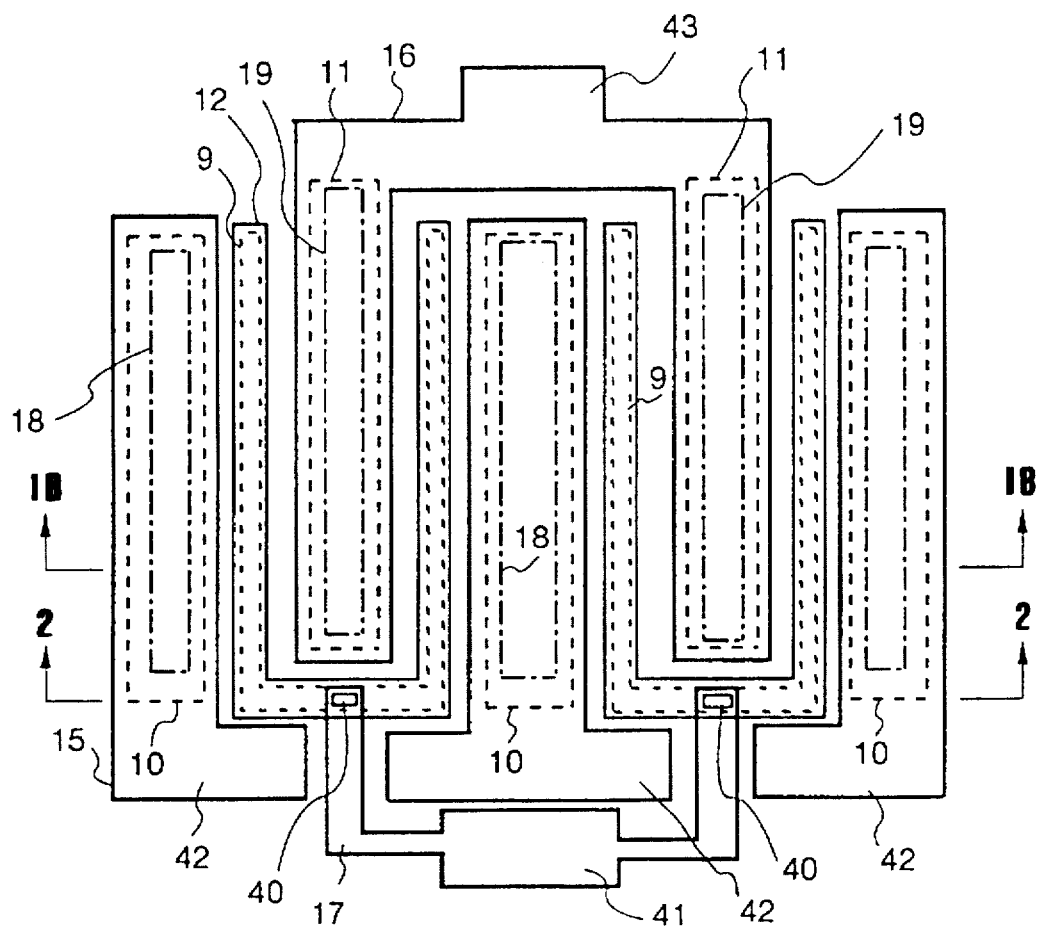
FIG. 1A is a plan view showing an embodiment of an insulated gate semiconductor device according to the present invention.
Figure 1B:
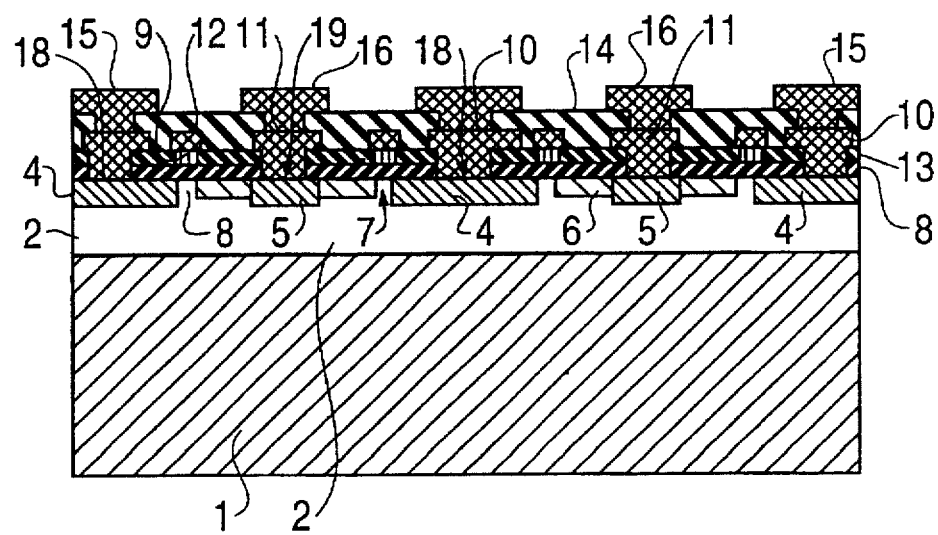
FIG. 1B is a sectional view taken on line I—I of FIG. 1A showing the configuration of an active region.
Figure 2:
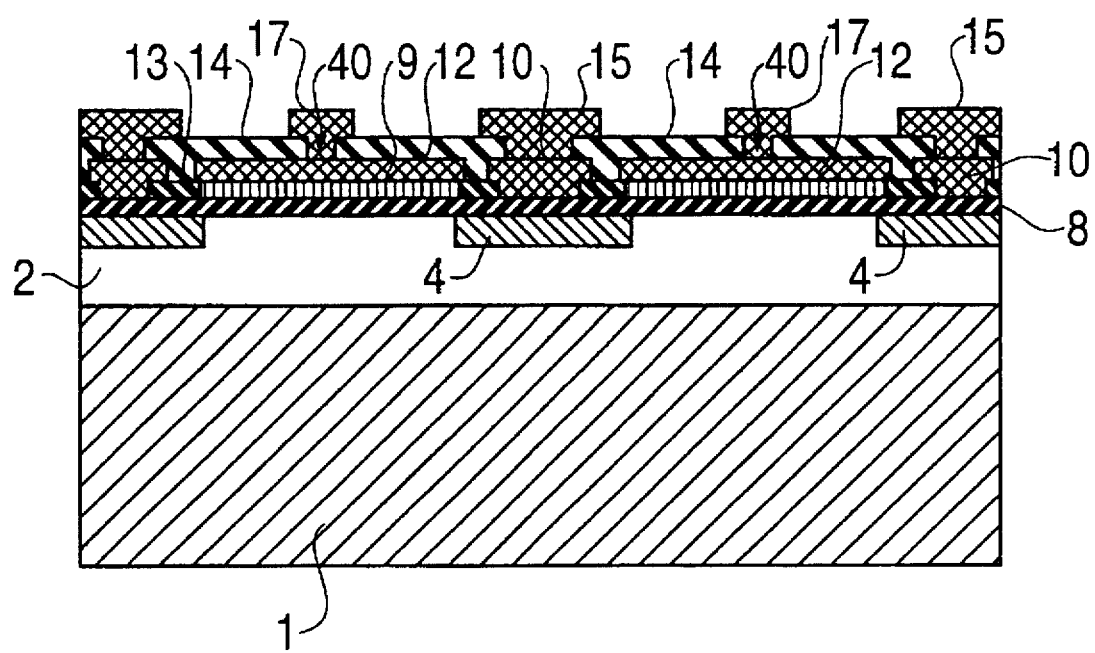
FIG. 2 is a sectional view taken on line II—II of FIG. 1A showing the configuration of a gate lead-out electrode portion.

A first embodiment of the insulated gate semiconductor device according to the present invention will be described with reference to FIGS. 1A, 1B and 2. FIG. 1A is a plan view of a high frequency/high output MOSFET as the first embodiment; FIG. 1B is a sectional view taken on line I—I of FIG. 1A showing the configuration of an active region portion; and FIG. 2 is a sectional view taken on line II—II of FIG. 1A showing the configuration of a gate lead-out electrode portion. In addition, in FIG. 1A, for a clearer understanding, only patterns of electrode layers and opening portions provided on an oxide film and interval insulators are shown, and patterns of impurity layers are omitted.

In FIGS. 1A and 1B, reference numeral 1 indicates a p-type semiconductor substrate having a resistivity of 0.01 Ωcm. A p-type silicon epitaxial layer 2 having a resistivity of 10 Ωcm is formed on the p-type semiconductor substrate 1 to a thickness of 4 μm by an epitaxy process. An n-type source layer 4 and drain layer 5 having a high impurity concentration respectively are formed in the surface of the epitaxial layer 2 by implantation of ions of phosphorous. An n-type drain layer 6 having a low impurity concentration is formed around the n-type drain layer 5 by implantation of ions of arsenic. The n-type drain layer 6 is effective to improve the withstanding voltage of the drain. In this embodiment, a channel region 7, that is, the gate length, specified by a distance between the n-type source layer 4 having a high impurity concentration and the n-type drain layer 6 having a low impurity concentration is set at 0.5 μm. A conductive layer 9 for a gate electrode, which is formed by patterning of a polycrystalline silicon layer (thickness: 0.1 μm) highly doped with phosphorous, is provided on the surface of the p-type epitaxial layer 2 through a gate oxide film 8 having a thickness of 25 nm. In addition, the n-type source layer 4 and the n-type drain layer 6 are, of course, formed in self-alignment relative to the conductive layer 9 for a gate electrode. A first aluminum layer source electrode 10 is connected to the n-type source layer 4 through an opening portion 18 formed in the gate oxide film 8 and an interval insulator 13. A first aluminum layer drain electrode 11 is also connected to the n-type drain layer 5 through an opening portion 19 formed in the gate oxide film 8 and the interval insulator 13. A first aluminum layer gate electrode 12 is connected onto the conductive layer 9 for a gate electrode which is made of the polycrystalline silicon. In this embodiment, as shown in FIG. 1A, center portions of two pieces of the U-shaped gate electrodes 12 are symmetrically connected to a gate bonding portion 41 as an electrode for gate external connection through opening portions 40 provided in the interval insulators 14 and also through second aluminum layer gate lead-out conductive layers 17. A second aluminum layer source electrode 15 is connected onto the first aluminum layer source electrode 10 formed in the source region through an opening portion provided in the interval insulator 14. The source electrode 15 extends outside the region of each stripe-shape source layer 4, to form a source bonding portion 42 as an electrode for source external connection. A second aluminum layer drain electrode 16 is connected onto the first aluminum layer drain electrode 11 through an opening portion provided in the interval insulator 14. The drain electrode 16 extends outside each of the stripe-shape drain layers 5 and 6, to form a drain bonding portion 43 as an electrode for drain external connection.

In this embodiment having the above-described configuration, the conductive layer for a gate electrode is of a double layer structure having the aluminum layer and the polycrystalline silicon layer and thereby it is reduced in its resistance. Moreover, the paths from the gate bonding portion 41 to respective gate-finger portions are symmetric to each other, to prevent the occurrence of an unbalance in gate resistance. Additionally, since the structure of the gate portion has the structure of the polycrystalline silicon/silicon oxide film/silicon, it is excellent in thermal stability. As a result, properties of the gate are not changed even after being subjected to a heat treatment at about 1000° C. The conductive layer for a gate electrode, which is made of polycrysatalline silicon, is easy to finely processed to the degree of 1 μm or less. Moreover, since the electrode for gate external connection is made of the second aluminum layer and further the conductive layer 17 for a gate electrode is arranged not to cross the source electrode 15, a parasitic capacitance between the gate and source is made smaller, so that the entire resistances and floating capacitances of the gate electrodes can be easily reduced. Thus, it becomes possible to significantly enhance high frequency characteristics and reliability of the MOSFET of the present invention as compared with conventional MOSFETS.

In an electric power amplifier for a cellular telephone using the trial high frequency/high output MOSFET according to this embodiment, the efficiency is increased up to 55% at an amplified output power of 2 W in an operational frequency band of 1.8 GHz. This is significantly improved in frequency and efficiency as compared with the conventional MOSFET in which the efficiency is 50% at an amplified output power of 2 W in an operational frequency band of 800 MHz.

Embodiment 2

Figure 3A:
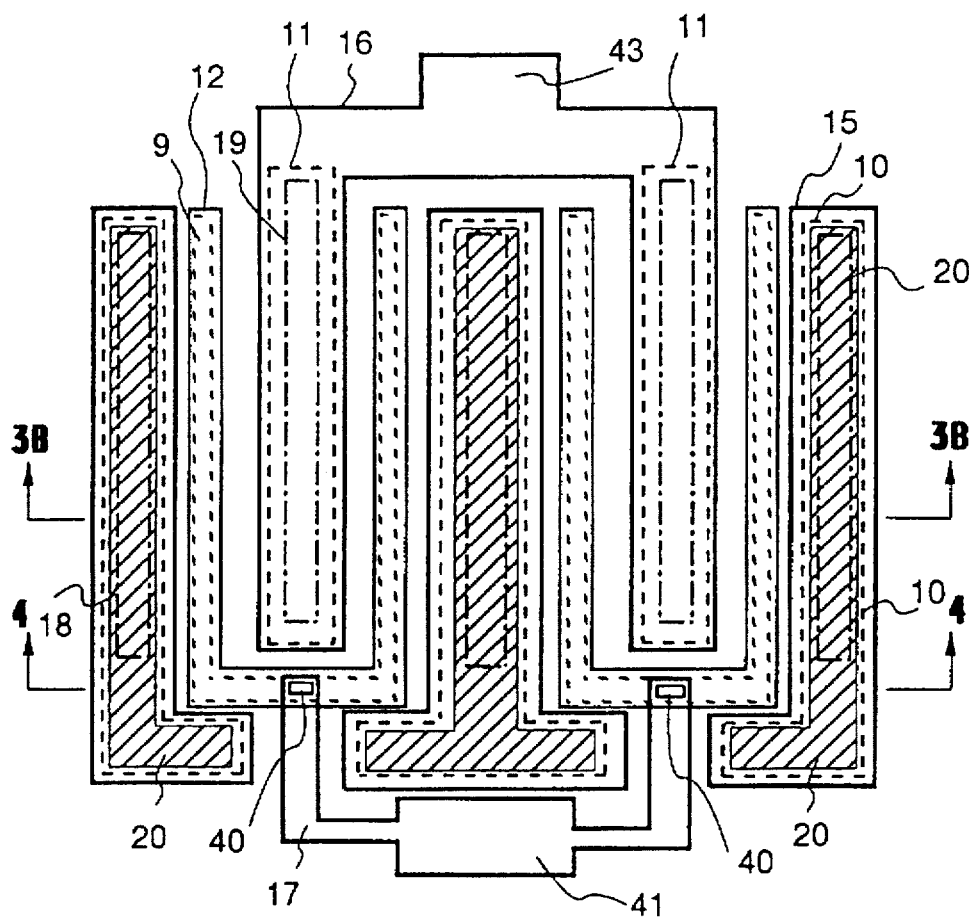
FIG. 3A is a plan view showing another embodiment of the insulated gate semiconductor device according to the present invention.
Figure 3B:
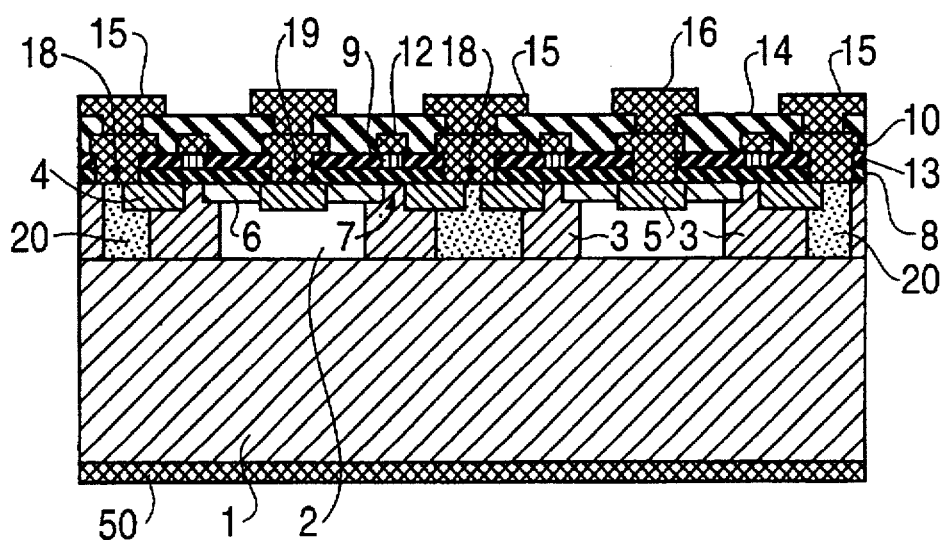
FIG. 3B is a sectional view taken on line I—I of FIG. 3A showing the configuration of an active region.
Figure 4:
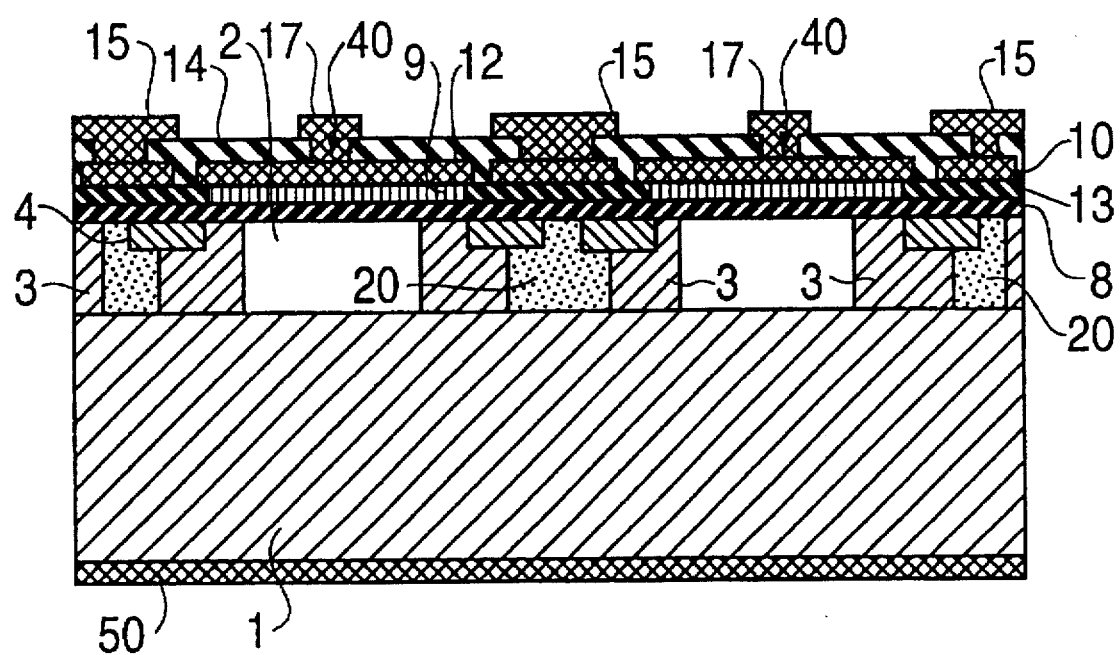
FIG. 4 is a sectional view taken on line II—II of FIG. 3A showing the configuration of a gate lead-out electrode portion.

Next, a second embodiment of the insulated gate semiconductor device of the present invention will be described with reference to FIGS. 3A, 3B and FIG. 4. FIG. 3A is a plan view of a high frequency/high output MOSFET as another embodiment; FIG. 3B is a sectional view taken on line I—I of FIG. 3A showing the configuration of an active region; and FIG. 4 is a sectional view taken on line II—II of FIG. 3A showing a gate lead-out electrode portion. In FIG. 3A of this embodiment, for a clearer understanding, electrode layers, opening portions provided in an oxide film and interval insulators, and reach-through layers are indicated, but a drain layer, source layer and a base layer are omitted. In FIGS. 3A, 3B and FIG. 4, portions identical to those of the first embodiment shown in FIGS. 1A, 1B and FIG. 2 are referred to by the same reference numerals, and detailed explanation thereof is omitted. This embodiment is different from the previous embodiment in the following points. A p-type reach-through layer 20 having a high impurity concentration is formed at a portion separated from a channel region 7 directly under a source electrode in such a manner as to reach a semiconductor substrate 1. A p-type base layer 3 is provided at a portion in the channel region 7 in such a manner as to reach the semiconductor substrate 1. Moreover, the n-type source layer 4, the p-type base layer 3 and the reach-through layer 20 are connected to a first aluminum layer source electrode 10 through an opening portion 18 formed in oxide films 8 and 13. The p-type base layer 3 may be formed by implantation of ions of boron. The p-type reach-through layer 20 having a high impurity concentration may be formed by ion implantation or deposition.

This embodiment having the above-described configuration exhibits the following advantages, in addition to those of the previous embodiment. In the high frequency/high output MOSFET of this embodiment, the p-type reach-through layer 20 having a high impurity concentration is provided. Accordingly, a source current can be taken out from the bottom surface source electrode 50 formed on the bottom surface of the semiconductor substrate 1 without any bonding wire, so that it becomes possible to reduce the source resistance and to eliminate an inductance component due to a bonding wire. Moreover, the provision of the p-type base layer 3 leads to control of a threshold value in the channel region 7 at a desirable value.

In the case where the p-type base layer 3 has a relatively high concentration, it may serve as the reach-through layer 20. The p-type reach-through layers 20 may be provided under the wide source electrodes of the first aluminum layer and the second aluminum layer which extend from one end of the source region, or may be provided under the wide source electrodes of the first aluminum layer and the second aluminum layer which extend from both the ends of the source region as shown in the third embodiment described later.

In an electric power amplifier for a cellular telephone using the trial high frequency/high output MOSFET according to this embodiment, the efficiency is increased up to 60% at an amplified output power of 2 W in an operational frequency band of 1.8 GHz. This is significantly improved in frequency and efficiency as compared with the conventional MOSFET in which the efficiency is 50% at an amplified output power of 2 W in an operational frequency band of 800 MHz.

Embodiment 3

Figure 5A:
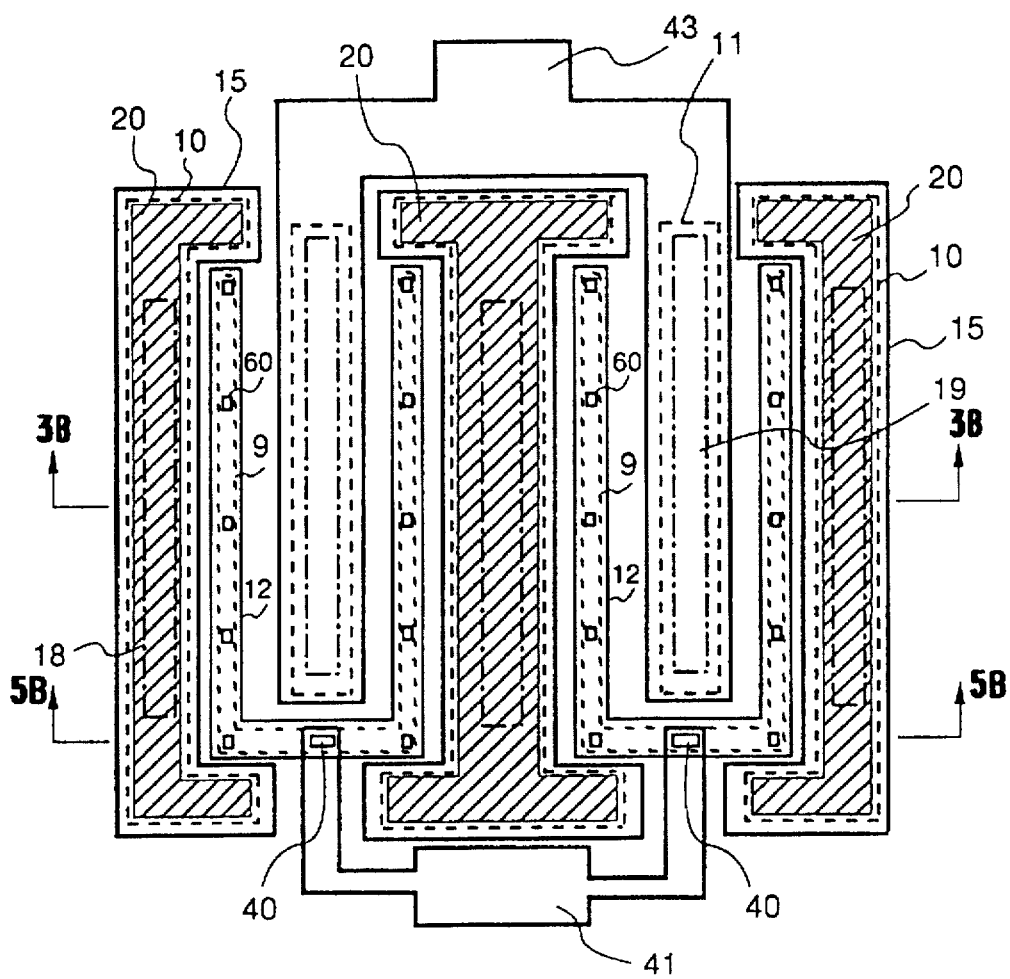
FIG. 5A is a plan view showing a further embodiment of the insulated gate semiconductor device according to the present invention.
Figure 5B:
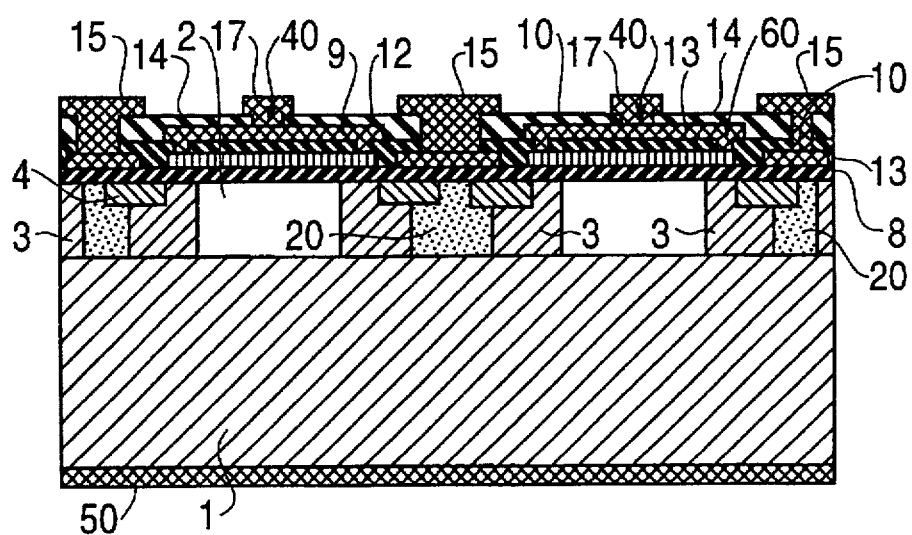
FIG. 5B is a sectional view taken on line II—II of FIG. 5A showing the configuration of a gate lead-out electrode portion.
Figure 6A:
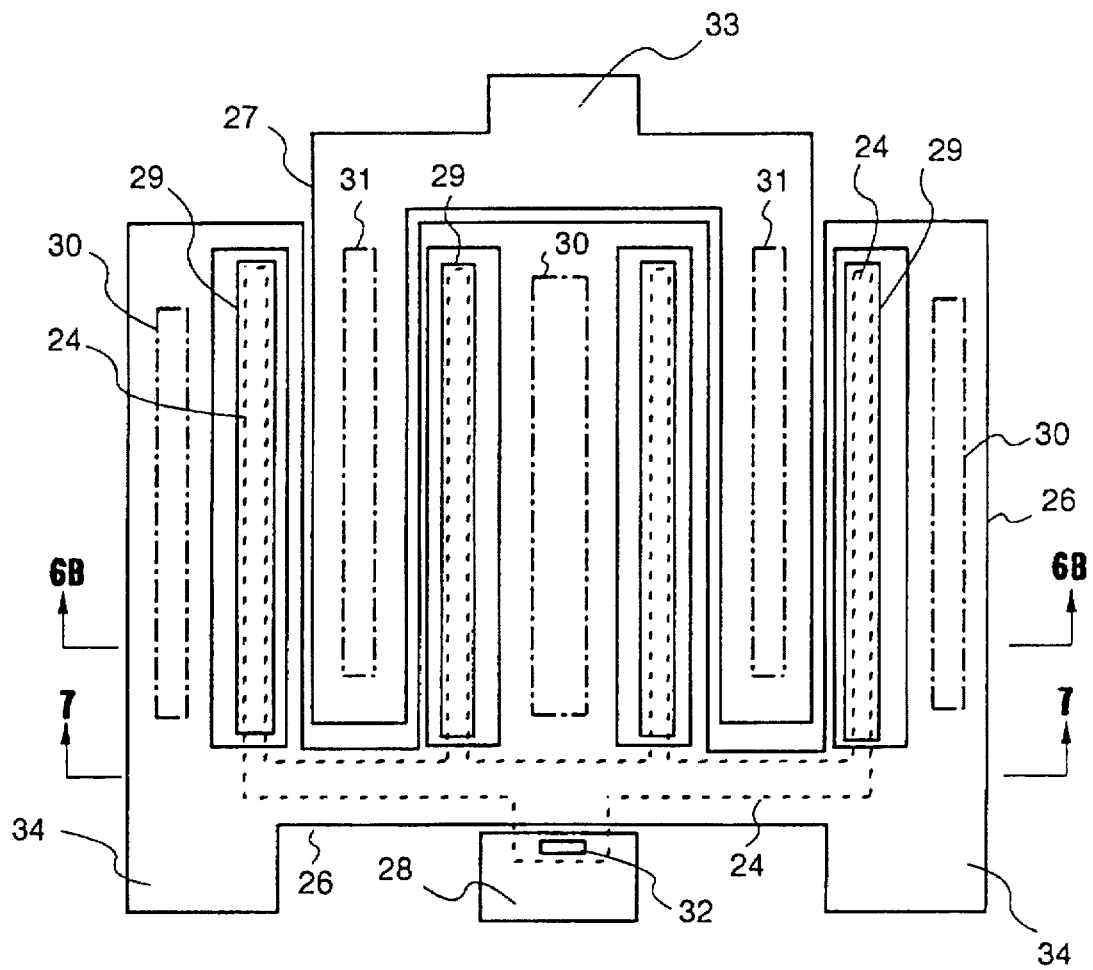
FIG. 6A is a schematic plan view showing the configuration of a prior art high frequency/high output MOSFET.
Figure 6B:
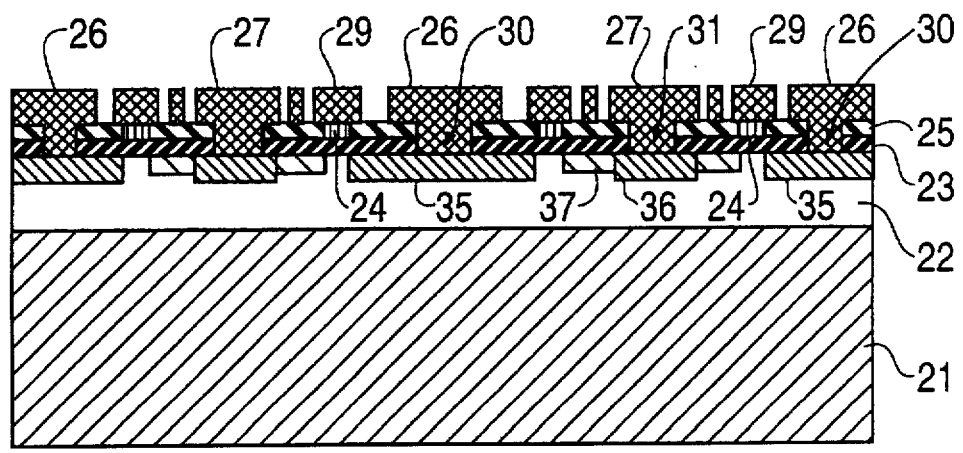
FIG. 6B is a sectional view taken on line I—I of FIG. 6A showing the configuration of an active region.
Figure 7:
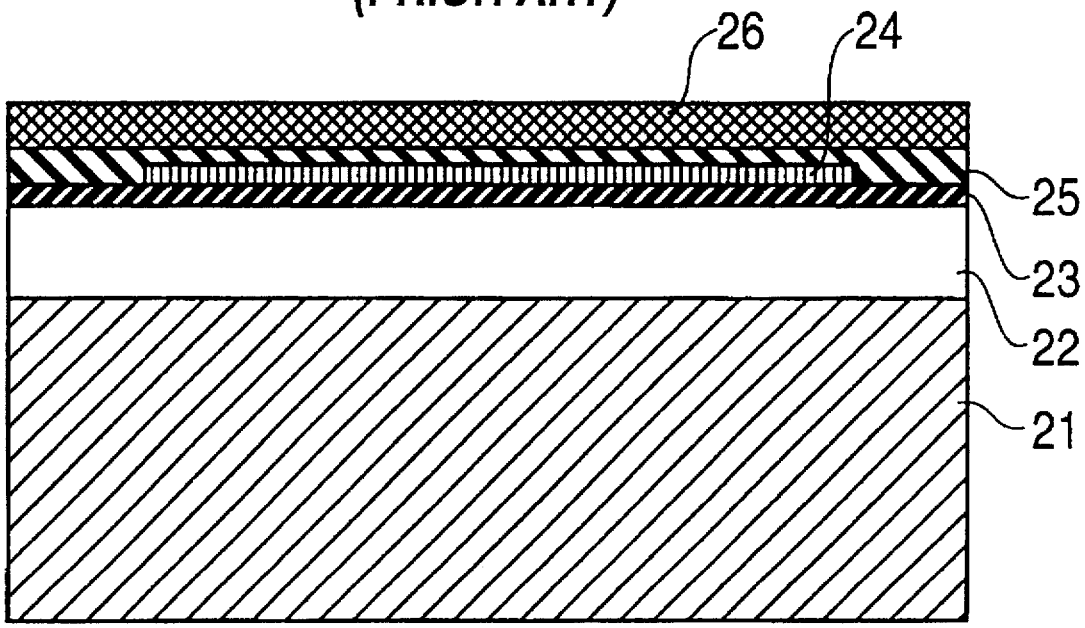
FIG. 7 is a sectional view taken on line II—II of FIG. 6A showing the configuration of a gate lead-out electrode portion.

Next, the third embodiment of the insulated gate semiconductor device of the present invention will be described with reference to FIGS. 5A and 5B. FIG. 5A is a plan view of a high frequency/high output MOSFET as the third embodiment; and FIG. 5B is a sectional view taken on line II—II of FIG. 5A showing the configuration of a gate lead-out electrode portion. In FIG. 5A, for a clearer understanding, electrode layers, opening portions formed in an oxide film and interval insulators, and a reach-through layer are shown, but a drain layer, source layer and a base layer are omitted. It is to be noted that the sectional configuration of the active region shown by line I—I of FIG. 5A is the same as that shown in FIG. 3B in Embodiment 2, and therefore, the explanation thereof is omitted.

This embodiment is different from Embodiment 2 in the following points. A polycrystalline silicon conductive layer 9 for a gate electrode is separated from a first aluminum layer gate electrode 12 by means of an interval insulator 13, and they are connected to each other through a plurality of small-sized rectangular opening portions 60 provided in the interval insulator 13. A first aluminum layer source electrode 10 and a second aluminum layer source electrode 15 extend from both the ends of a channel region, and the p-type reach-through layers 20 are provided at the widely extended electrode portions. In addition, in this embodiment, the opening portions 60 of the gate-finger portion of the polycrystalline silicon conductive layer 9 for a gate electrode are provided in such a manner as to be spaced from each other at intervals of e.g. 20 µm.

This embodiment having the above configuration has the following features, in addition to the advantages of Embodiment 2. In the high frequency/high output MOSFET in this embodiment, the p-type reach-through layers 20 having a high impurity concentration are provided in wide electrode portions which are the portions of the first layer aluminum source electrode 10 and the second aluminum layer source electrode 15 extending from both the ends of the channel region. Accordingly, the source resistance can be further reduced as compared with Embodiment 2, thus enhancing high frequency characteristics. Moreover, since a plurality of the opening portions 60 are provided in the interval insulator 13 between the polycrystalline silicon conductive layer 9 for a gate electrode and the first aluminum layer gate electrode 12, it becomes possible to reduce a damage to the polycrystalline silicon conductive layer 9 for a gate electrode due to over etching as compared with the case where an elongated opening portion is formed, and hence to obtain a desirable connection even when the width of the gate-finger portion is made fine. In the configuration of this embodiment, since the inductance of the source is made lower, high frequency characteristics can be also obtained.

In addition, according to the configuration of this embodiment, since the source electrode is taken out from the bottom surface of the substrate and the drain electrodes can be provided over the whole front surface, the heat generated from the channel can be easily scattered, so that the thermally breaking strength can be improved more than that of the conventional example.

As described above, according to the present invention, a gate electrode of the insulated gate semiconductor device can be finely processed; the resistances of wirings extending from gate-finger portions to a gate bonding portion can be reduced without any unbalance in the resistance; and the floating capacitance can be reduced because the lead-out wirings between the source and gate are arranged without crossing. Thus, a high frequency performance fully operable in a frequency band ranging from 1 GHz to 5 GHz can be obtained. In addition, since each of the source electrode and the drain electrode is of a double layer structure and thereby it can be increased in thickness, a high output performance can be obtained without any limitation in current capacity.

Although the preferred embodiments of the present invention have been described, such description is for illustrative purposes only, and it is to be understood that changes and variations may be made without departing from the spirit and scope of the present invention. For example, a p-channel MOSFET can, of course, be of obtained by changing the conductivity type.

What is claimed is:

1. An insulated gate semiconductor device comprising:
   a semiconductor substrate having a first conductivity type;
   a semiconductor layer having the first conductivity type, which is formed on said semiconductor substrate;
   a plurality of drain regions and source regions, each having a second conductivity type, which are alternating provided in the surface of said semiconductor layer;
   a plurality of channel regions having the first conductivity type, which are each respectively formed between a corresponding said drain region and a corresponding said source region;
   a plurality of gate electrodes respectively provided on said channel regions through gate insulators, wherein said gate electrodes are comprised of a plurality of first layer gate electrodes each having a gate conductive layer formed on one of the gate insulators and a plurality of second layer gate electrodes each having a first gate metal conductive layer formed on a corresponding said gate conductive layer and having a resistance lower than that of said corresponding gate conductive layer;
   a first interval insulator provided between a portion of one of said gate insulators and a portion of one of said first gate metal conductive layers for each of said gate electrodes;
   a second interval insulator provided in such a manner as to cover said first gate metal conductive layers;
   a second gate metal conductive layer provided on said second interval insulator;
   a plurality of first layer drain electrodes made of first drain metal conductive layers, which are respectively connected to said drain regions through first opening portions formed in said first interval insulator provided on said drain regions;
   a plurality of first layer source electrodes made of first source metal conductive layers, which are respectively connected to said source regions through second opening portions formed in said first interval insulator provided on said source regions;
   wherein each of said first gate metal conductive layers and each of said gate conductive layers contact one another to form a corresponding said gate electrode through a third opening portion formed in said first interval insulator;
   a plurality of second layer drain electrodes made of second drain metal conductive layers which each have first and second ends and which are arranged such that the first end is connected to a corresponding said first layer drain electrode through a first opening portion formed in said second interval insulator provided on said corresponding first layer drain electrode and the second end is connected to the second end of adjacent second layer drain electrode;
   a plurality of second layer source electrodes made of second source metal conductive layers, which each have first and second ends and which each are arranged such that the first end is connected to said first layer source electrode through a second opening portion formed in said second interval insulator provided on said first layer source electrode and the second end form an extended portion positioned outside said channel region;
   wherein said gate electrodes, which are adjacent to each other with said first layer drain electrodes respectively interposed therebetween, extend outside said channel regions on the first end side of said second layer drain electrodes such that groups of said gate electrodes are connected to each other to form connection portions;
   a plurality of third layer gate electrodes, which are made of second gate metal conductive layers and which each have first and second ends, wherein each of said third layer gate electrodes is arranged such that the first end is connected to a corresponding one of said connection portions of said gate electrodes through a third opening portion formed in said second interval insulator at a center of said corresponding one of said connection portions of said gate electrodes, and the second end extend to be commonly connected to one another by an electrode for gate external connection through a space between the adjacent extended portions of the second layer source electrodes; and
   wherein said electrode for gate external connection is provided at the center of the commonly connected portion of said third layer gate electrodes.

2. An insulated gate semiconductor device according to claim 1, wherein said third opening portion for connecting said gate conductive layer to said first gate metal conductive layer to form said each of said gate electrodes is provided in said first interval insulator at a plurality of locations for each gate electrode.

3. An insulated gate semiconductor device according to claim 1, wherein a reach-through layer having the first conductivity type is provided in said semiconductor layer directly under said extended portion of each of said second layer source electrodes in such a manner as to reach said semiconductor substrate, and a bottom surface source electrode is provided on the bottom surface of said semiconductor substrate.

4. An insulator gate semiconductor device according to claim 3, wherein said reach-through layer is provided in a portion separated from a corresponding said channel region directly under each of said extended portions of said sacond layer source electrodes.

5. An insulator gate semiconductor device according to any one of claims 1 to 4, wherein at least one base layer having the first conductivity type is further provided in both one of said channel regions and under one of said source regions of said semiconductor layer in such a manner as to reach said semiconductor substrate.

6. An insulated gate semiconductor device according to any one of claims 1 to 4, wherein each of said gate conductive layers is comprised of a polycrystalline silicon or a metal silicide.

* * * * *